(12) United States Patent
Cong

(10) Patent No.: US 7,659,782 B2
(45) Date of Patent: Feb. 9, 2010

(54) APPARATUS AND METHOD TO REDUCE JITTER IN A PHASE LOCKED LOOP

(75) Inventor: Yonghua Cong, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 37 days.

(21) Appl. No.: 11/598,104

(22) Filed: Nov. 13, 2006

(65) Prior Publication Data

US 2008/0074200 A1     Mar. 27, 2008

Related U.S. Application Data

(60) Provisional application No. 60/847,090, filed on Sep. 26, 2006.

(51) Int. Cl.
*H03L 7/00* (2006.01)

(52) U.S. Cl. .......................................... 331/16; 331/17

(58) Field of Classification Search .................... 331/17, 331/16
See application file for complete search history.

(56) References Cited

U.S. PATENT DOCUMENTS

2005/0062550 A1* 3/2005 Melanson ...................... 331/17
2007/0030078 A1* 2/2007 Wilson ........................ 331/16

* cited by examiner

*Primary Examiner*—Joseph Chang
(74) *Attorney, Agent, or Firm*—Sterne, Kessler, Goldstein & Fox P.L.L.C

(57) ABSTRACT

A circuit and method to reduce jitter and/or noise in a phase-locked loop (PLL). A voltage-controlled oscillator (VCO) control signal is tapped and filtered to create a low-noise, filtered VCO control signal. The filtered and unfiltered control signals are individually weighted and then combined to create a modified VCO control signal which reduces the jitter and/or the noise by reducing an effect of VCO gain on the jitter and/or the noise.

19 Claims, 4 Drawing Sheets

Low Jitter PLL

Low Jitter PLL

Low Jitter PLL

Low Jitter PLL

APPARATUS AND METHOD TO REDUCE JITTER IN A PHASE LOCKED LOOP

CROSS REFERENCE TO RELATED APPLICATIONS

This application claims the benefit of U.S. Provisional Application No. 60/847,090, filed Sep. 26, 2006, which is incorporated herein by reference in its entirety.

FIELD OF THE INVENTION

The present invention is generally directed to a phase-locked loop (PLL). More particularly, the invention relates to an apparatus and method for reducing PLL jitter and/or noise.

BACKGROUND OF THE INVENTION

Jitter is an important performance parameter in a phase-locked loop (PLL). Jitter is a variation in signal timing and is caused in part by random noise. One source of random noise is resistance in the PLL's loop filter. This random noise is converted to timing jitter by the PLL's voltage-controlled oscillator (VCO). Too much PLL jitter and/or noise can dominate the signal being processed and even cause eye closure in some cases. The result is that the PLL will not accurately track an input signal.

One method to reduce jitter is to reduce the loop filter resistance. However, reducing the loop filter resistance causes an undesirable effect of increasing PLL bandwidth. Greatly increasing a loop filter capacitance counters the loop bandwidth increases. Unfortunately, increasing loop filter capacitance in an integrated loop filter requires inefficient use of a large area on a die.

Reducing VCO gain also lowers PLL jitter. The VCO gain is a change in a VCO output frequency for a change in a VCO control voltage (Vc). The following equation determines the VCO gain:

$$K_{vco} = \frac{\Delta VCO \text{ Output Frequency}}{\Delta VCO \text{ Control Voltage}}$$

Thus, lowering the VCO output frequency range and/or increasing the VCO control voltage range reduces VCO gain. However, constraints imposed by modern circuit frequency and power supply voltage requirements limit reducing the VCO gain. High frequency requirements of modern circuits limit reducing the VCO output frequency range. A low-frequency range VCO simply does not meet needs of modern circuits. Furthermore, increasing the VCO control voltage range is limited by power supply voltage requirements imposed by ever-shrinking integrated circuit process feature size. As the process feature size decreases, maximum power supply voltage also decreases, therefore reducing the VCO control voltage range. Thus, reducing the loop filter resistance is typically preferred to reducing the VCO gain to lower the PLL jitter.

What is needed is an apparatus and method to reduce the PLL jitter with minimal area increase, minimal impact on the PLL bandwidth, and/or low power consumption, as well as overcoming other shortcomings noted above.

BRIEF SUMMARY OF THE INVENTION

In an exemplary embodiment of the present invention, a method and apparatus reduce jitter and/or noise in a phase-locked loop (PLL). In an embodiment, a voltage-controlled oscillator (VCO) control signal is tapped and filtered to create a low-noise, filtered VCO control signal. The filtered and unfiltered control signals are individually weighted and then added to create a modified VCO control signal which reduces the PLL jitter and/or noise by reducing an effect of VCO gain on the PLL jitter and/or noise.

A PLL loop filter provides a noisy, or "fast", VCO control voltage and a VCO input voltage tapped from the fast control voltage. A filter filters the VCO input voltage and produces a "slow" control voltage. In a stopband of the filter, the slow control voltage has less noise than the fast VCO control voltage. The fast control voltage is weighted by a factor "α" by a first proportioning circuit. The slow control voltage is weighted by a factor "β", where α+β=1, by the second proportioning circuit. The outputs of the first and second proportioning circuits add to create a modified control voltage. The modified control voltage controls a frequency of a VCO output, thus reducing the jitter and/or noise in the PLL.

In an embodiment, a fast proportioning circuit weights the fast control voltage by the factor α and multiplies the fast control voltage by a fast proportioning transconductance to create a fast control current. A slow proportioning circuit weights the slow control voltage by the factor β, where α+β=1. The slow proportioning circuit also multiplies the slow control voltage by a slow proportioning transconductance to create a slow control current. A node adds the fast control current and the slow control current to form a VCO control current. The VCO control current controls a frequency of a current-controlled oscillator to reduce the jitter and/or noise in the PLL.

In a first step of an exemplary method to reduce the jitter and/or noise in the PLL, the VCO fast control voltage is filtered to produce the slow control voltage. In a second step, the VCO that is part of the phase-locked loop (PLL) is controlled in part with the VCO fast control voltage and in part with the slow control voltage to reduce the PLL jitter and/or noise.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
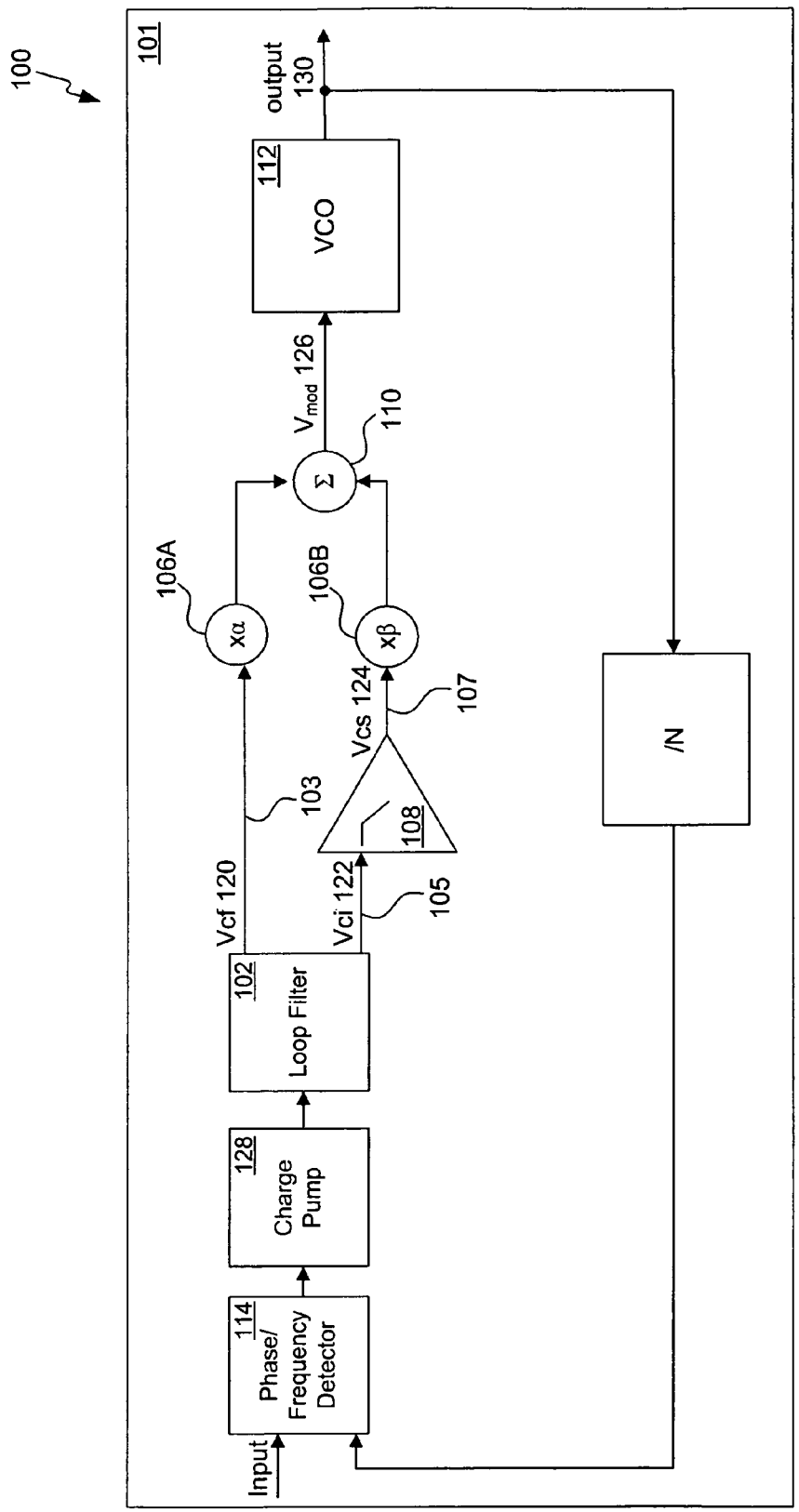
FIG. 1 illustrates a block diagram of an embodiment showing a circuit that modifies a VCO control signal.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

As introduced above, various embodiments of the invention involve an apparatus and/or method for reducing jitter and/or noise in a phase-locked loop (PLL). FIGS. 1-4, described below, illustrate this approach.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Reducing effects of voltage-controlled oscillator (VCO) with a high gain (Kvco) on a jittery and/or noisy VCO control signal reduces phase-locked loop (PLL) jitter and/or noise. FIG. 1 illustrates a block diagram of an exemplary low-jitter PLL 100 where altering the VCO control signal reduces the VCO gain. In the PLL 100, a loop filter 102 has at least two outputs. A first output 103 is coupled to a first proportioning circuit 106A. A second output 105 is coupled to a filter 108. In examples, the first output 103 is coupled to the second output 105. In examples, the loop filter 102 has multiple outputs coupled to multiple filters and multiple proportioning circuits.

The filter 108 is a low-noise, low-bandwidth, low-pass filter. The filter 108 has a low bandwidth so as not to affect PLL 100 loop bandwidth, phase margin, and stability. A filter output 107 is coupled to a second proportioning circuit 106B. The output of the first proportioning circuit 106A and the second proportioning circuit 106B are coupled to a summation circuit 110. The output of the summation circuit 110 is coupled to a VCO 112. An output of the VCO 112 is coupled to the PLL output 130. At least part of the PLL 100 is deposited on a substrate 101. In examples, the first proportioning circuit 106A and the second proportioning circuit 106B share common circuitry. In examples, the filter 108, the first proportioning circuit 106A, the second proportioning circuit 106B, and/or the summation circuit 110 use little integrated circuit area and/or consume negligible power. In examples, circuit elements described herein as being coupled to ground are coupled to a voltage source other than ground.

The PLL 100 functions as follows. The loop filter 102 provides the noisy, or "fast", VCO control voltage (Vcf) 120 as well as a VCO input voltage (Vci) 122. The VCO input voltage (Vci) 122 is tapped from the fast control voltage (Vcf) 120. Filter 108 filters the VCO input voltage (Vci) 122 and produces a "slow" control voltage (Vcs) 124. At the output of the filter 108, the slow control voltage (Vcs) 124 has less noise and/or jitter than the fast VCO control voltage (Vcf) 120. The fast control voltage (Vcf) 120 is weighted by a factor "α" by the first proportioning circuit 106A. The slow control voltage (Vcs) 124 is weighted by a factor "β", where α+β=1, by the second proportioning circuit 106B. In examples, signal processing performed on the fast control voltage (Vcf) 120 develops the VCO input voltage (Vci) 122. In examples, multiple proportioning circuits weight multiple filtered voltages, where the total of factors in all proportioning circuits equals one.

The outputs of the first proportioning circuit 106A and the second proportioning circuit 106B are summed to create a modified control voltage (Vmod) 126. The modified control voltage (Vmod) 126 controls the frequency of the VCO output 130, thus reducing jitter and/or noise in the PLL. In examples, multiple control voltages that are filtered and/or weighted are summed to create the modified control voltage (Vmod) 126.

Performance of the VCO 112 is unaltered by using the fast control voltage (Vcf) 120 and the slow control voltage (Vcs) 124. In an absence of jitter and noise, the fast control voltage (Vcf) 120 is substantially equivalent to the slow control voltage (Vcs) 124 and thus, $\alpha \cdot Vcf + \beta \cdot Vcs = Vcf$. Therefore, there are no detrimental effect on the VCO 112 performance including, and not limited to, effect on oscillating frequency, tuning range, and/or gain linearity. In addition, only a part of the fast control voltage (Vcf) 120 determined by the factor α controls the VCO 112, thus applying only a part of the jitter and/or noise present in the fast control voltage (Vcf) 120 to the VCO 112. The filter 108 reduces jitter and/or noise in the slow control voltage (Vcs) 124, which reduces the jitter and/or noise applied to the VCO 112 via the slow control voltage (Vcs) 124. Thus, the VCO 112 is controlled by a low-jitter modified control voltage (Vmod) 126 where jitter has been reduced by a factor of 1/α.

Furthermore, in examples, the equivalent VCO gain is also reduced by a factor of 1/α. The factor α, the factor β, and the other design parameters of the PLL loop 100 are selected such that using the slow control voltage (Vcs) 124 has minimal effect on PLL bandwidth, phase margin, and/or loop response. In examples, increasing the gain of the loop filter 102 by a factor of 1/α counters the effect of VCO gain reduction to the loop response. In examples, increasing a charge pump current of a charge pump 128 by a factor of 1/α counters the effect of VCO gain reduction to the loop response. In an example, the low-jitter PLL 100 is part of a switching circuit. The low-jitter PLL 100 may be part of a communication circuit.

Figure 2:
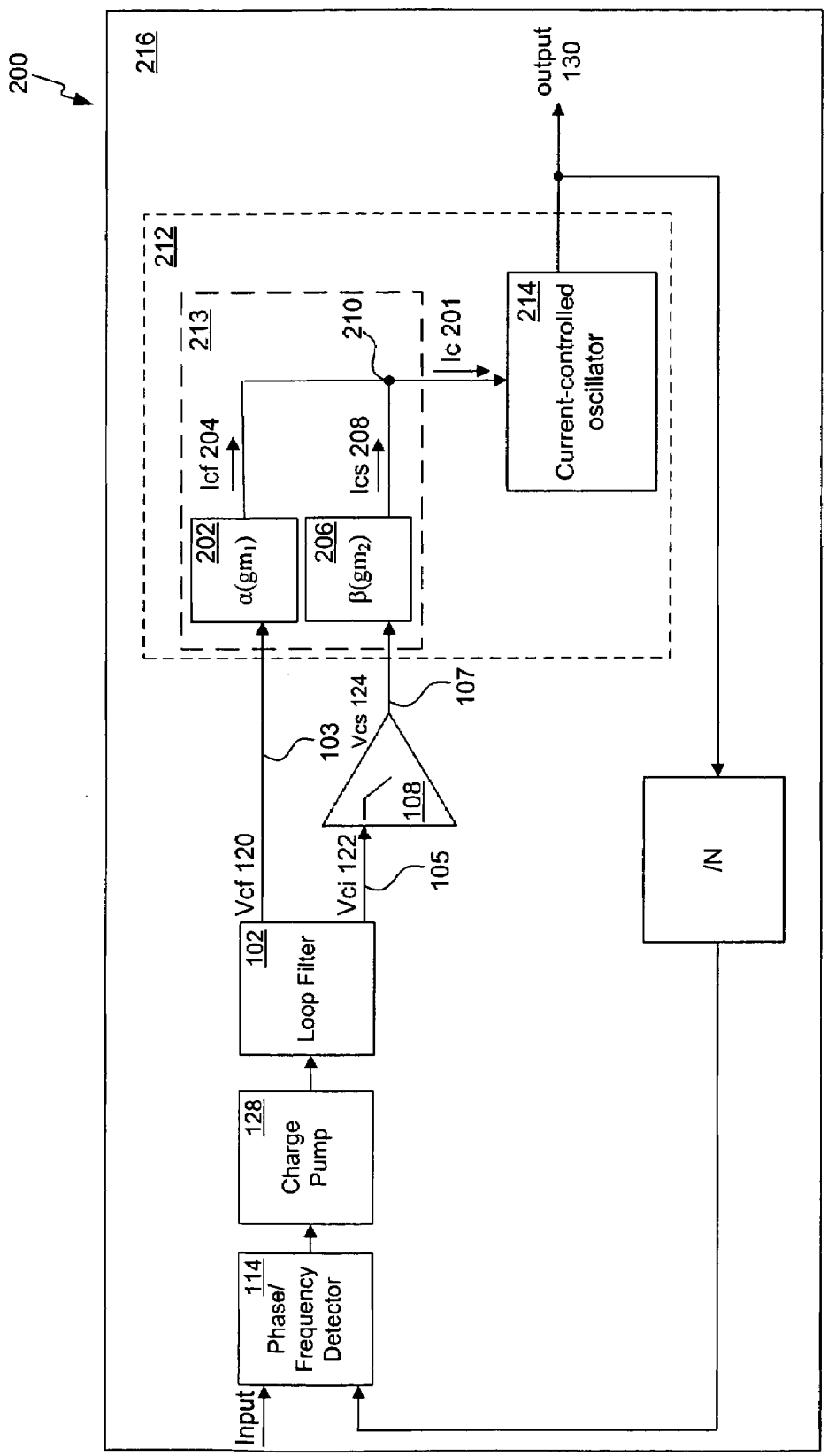
FIG. 2 illustrates a block diagram of an embodiment having a current as a VCO control signal.

FIG. 2 illustrates a block diagram of an embodiment in a form of a low-jitter PLL 200 having a control current (Ic) 201 as a VCO control signal. A VCO 212 has a voltage to current converter 213 having a fast proportioning circuit 202, a slow proportioning circuit 206, and a node 210. The first output 103 of the loop filter 102 is coupled to the fast proportioning circuit 202. The filter output 107 of the filter 108 is coupled to the slow proportioning circuit 206. The fast proportioning circuit 202 and the slow proportioning circuit 206 are coupled to an input of a current-controlled oscillator 214 via the node 210. The current-controlled oscillator 214 is coupled to the PLL output 130. At least part of the PLL 200 is deposited on a substrate 216. In examples, the current controlled oscillator 214 is a ring oscillator. In examples, the filter 108, the fast proportioning circuit 202, and the slow proportioning circuit 206 use minimal integrated circuit area and/or consume negligible power. In examples, the loop filter 102 has multiple outputs coupled to multiple filters and multiple proportioning circuits.

The PLL 200 functions as follows. The loop filter 102 and the filter 108 function as described above. The fast proportioning circuit 202 weights the fast control voltage (Vcf) 120 by the factor α and multiplies the fast control voltage (Vcf) 120 by a fast proportioning transconductance ($gm_1$) to create a fast control current (Icf) 204. Thus, the equation: Icf=Vcf·α·$gm_1$ determines the fast control current (Icf) 204.

The slow proportioning circuit 206 weights the slow control voltage (Vcs) 124 by the factor β, where α+β=1. The slow proportioning circuit 206 also multiplies the slow control voltage (Vcs) 124 by a slow proportioning transconductance ($gm_2$) to create a slow control current (Ics) 208. Thus, the equation: Ics=Vcs·β·$gm_2$ determines the slow control current (Ics). The node 210 adds the fast control current (Icf) 204 and the slow control current (Ics) 208 to form the control current (Ic) 201. The control current (Ic) 201 controls the current-controlled oscillator 214 to reduce jitter and/or noise in the PLL. In examples, multiple control currents are summed to create the control current (Ic) 201.

Using the fast control current (Icf) 204 and the slow control current (Ics) 208 does not alter performance of the current-controlled oscillator 214 including, and not limited to, oscillating frequency, tuning range, and/or gain linearity. In addition, only a part of the fast control voltage (Vcf) 120 determined by the factor α controls the current-controlled oscillator 214, thus applying only a part of the jitter and/or noise present in the fast control voltage (Vcf) 120 to the current-controlled oscillator 214. The filter 108 reduces jitter and/or noise in the slow control voltage (Vcs) 124, which reduces the jitter and/or noise applied to the current-controlled oscillator 214. Thus, the current-controlled oscillator 214 is controlled by a low-jitter control current (Ic) 201 where jitter has been reduced by a factor of 1/α.

Furthermore, in examples, the equivalent VCO gain is also reduced by a factor of 1/α. The factor α, the factor β, and the other design parameters of the PLL loop 200 are selected such that using the slow control voltage (Vcs) 124 and the slow control current (Ics) 208 have minimal effect on PLL bandwidth, phase margin, and/or loop response. In examples, increasing the gain of the loop filter 102 by a factor of 1/α counters the effect of VCO gain reduction to the loop response. In examples, increasing the charge pump current of the charge pump 128 by a factor of 1/α counters the effect of VCO gain reduction to the loop response. In an example, the low-jitter PLL 200 is part of a switching circuit. The low-jitter PLL 200 may be part of a communication circuit.

Figure 3:
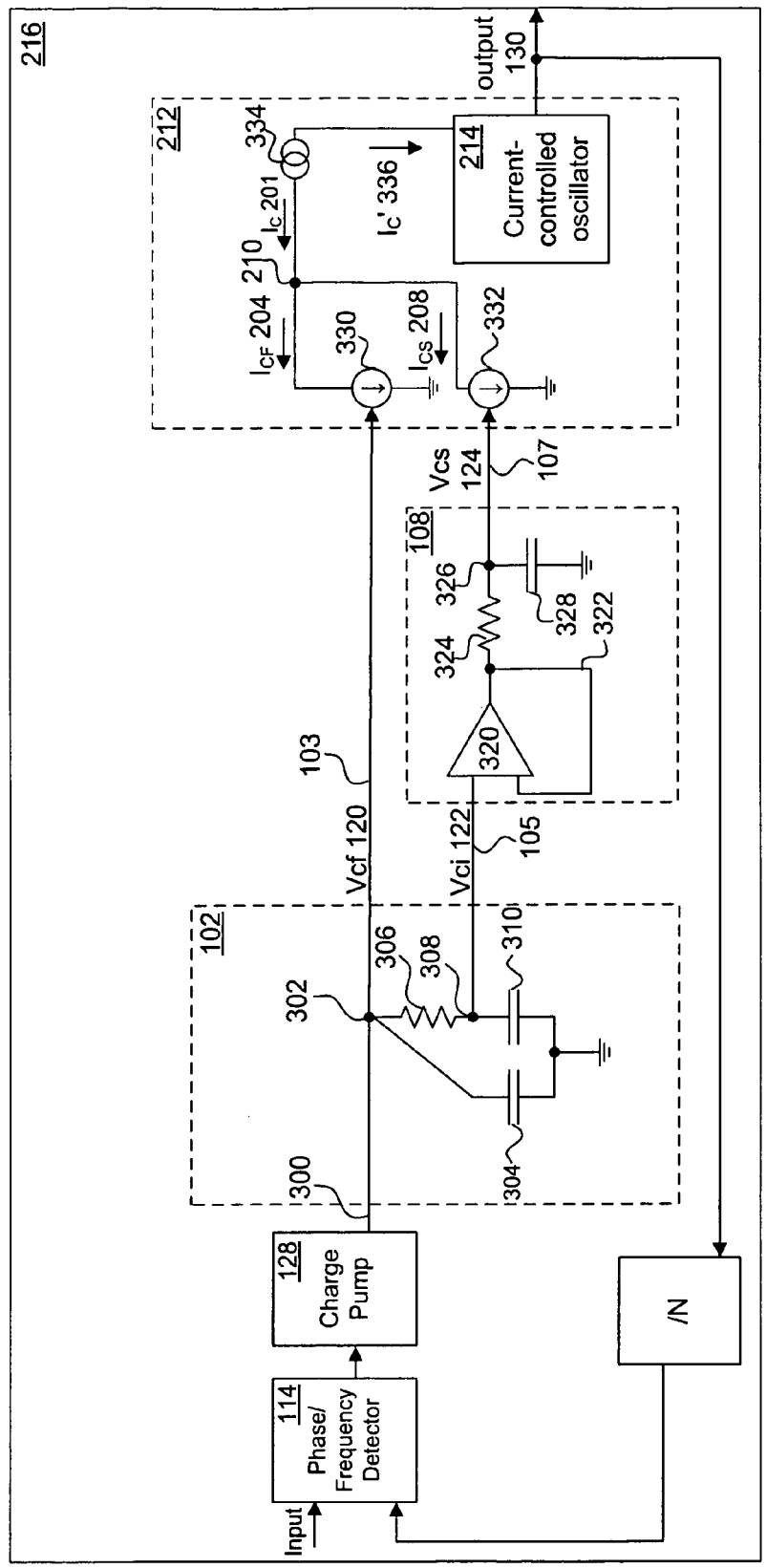
FIG. 3 illustrates a block diagram of another embodiment having a current as a VCO control signal.

FIG. 3 illustrates a block diagram that further describes embodiments as discussed below. A loop filter input 300 is coupled to the first loop filter output 103 via a first node 302. A first capacitor 304 is coupled between ground and the first node 302. A first resistor 306 is coupled between the first node 302 and a second node 308. A second capacitor 310 is coupled between the second node 308 and ground. The second node 308 is coupled to the second output 105. In examples, the second capacitor 310 has a higher capacitance than the first capacitor 304. In examples, the first node 302 is coupled to the second output 105.

The loop filter second output 105 is coupled to a first input of an amplifier 320. An amplifier output 322 is coupled to a second input of the amplifier 320. A filter resistor 324 is coupled between a filter node 326 and the amplifier output 322. The filter node 326 is coupled to the filter output 107. A filter capacitor 328 is coupled between the filter node 326 and ground. In examples, the filter 108 is a low bandwidth buffer. In examples, the filter resistor 324 has higher resistance than the first resistor 306. In examples, the filter capacitor 328 has less capacitance than the second capacitor 310.

The loop filter first output 103 is coupled to control a first variable current source 330. The filter output 107 is coupled to control a second variable current source 332. Outputs of the first and second variable current sources 330, 332 are coupled to a mirror circuit 334 via the node 210. The mirror circuit 334 is also coupled to an input of the current-controlled oscillator 214. The output of the current-controlled oscillator 214 is coupled to the PLL output 130. In examples, the mirror circuit 334 is a current mirror.

The exemplary PLL 200 of FIG. 3 functions as follows. The loop filter 102 filters an input signal with the first capacitor 304, the second capacitor 310, and the first resistor 306 to create the fast control voltage (Vcf) 120. The loop filter first output 103 carries the fast control signal (Vcf) 120. The signal on the second node 308, denoted as Vci (122), in the loop filter has a lower bandwidth than the fast control voltage (Vcf). The loop filter second output 105 carries the control signal (Vci) 122.

The filter 108 filters the control signal (Vci) 122 to further reduce its bandwidth. The amplifier 320 is a voltage follower that buffers the control signal (Vci) 122. The output of the amplifier 320 is low-pass filtered by the filter resistor 324 and the filter capacitor 328 to create the slow control voltage (Vcs) 124.

The VCO 212 generates an oscillating signal with a frequency that is controlled by the fast control voltage (Vcf) 120 and the slow control voltage (Vcs) 124. The first variable current source 330 proportions, or weights, the fast control voltage (Vcf) 120 by the factor α and multiplies the fast control voltage (Vcf) 120 by the fast proportioning transconductance ($gm_1$) to create the fast control current (Icf) 204. Thus, the equation: Icf=Vcf·α·$gm_1$ determines the fast control current (Icf) 204.

The second variable current source 332 proportions, or weights, the slow control voltage (Vcs) 124 by the factor β, where α+β=1. The second variable current source 332 also multiplies the slow control voltage (Vcs) 124 by the slow proportioning transconductance ($gm_2$) to create the slow control current (Ics) 208. Thus, the equation: Ics=Vcs·β·$gm_2$ determines the slow control current (Ics) 208.

The node 210 adds the fast control current (Icf) 204 and the slow control current (Ics) 208 to form the control current (Ic) 201. The control current (Ic) 201 controls the mirror circuit 334. The mirror circuit 334 mirrors the control current (Ic) 201 to form the mirrored control current (Ic') 336. The mirror circuit 334 also provides isolation, matches impedance, maintains signal linearity, and/or prevents reverse signal leakage from the current-controlled oscillator 214. The mirrored control current (Ic') 336 controls the current-controlled oscillator 214 to reduce jitter and/or noise in the PLL 200.

In addition, only a part of the fast control voltage (Vcf) 120 determined by the factor α controls the current-controlled oscillator 214, thus applying only a part of the jitter and/or noise present in the fast control voltage (Vcf) 120 to the current-controlled oscillator 214. The filter 108 reduces jitter and/or noise in the slow control voltage (Vcs) 124, which reduces the jitter and/or noise applied to the current-controlled oscillator 214. Thus, the current-controlled oscillator 214 is controlled by a low-jitter control current (Ic) 201 where jitter has been reduced by a factor of 1/α.

Figure 4:
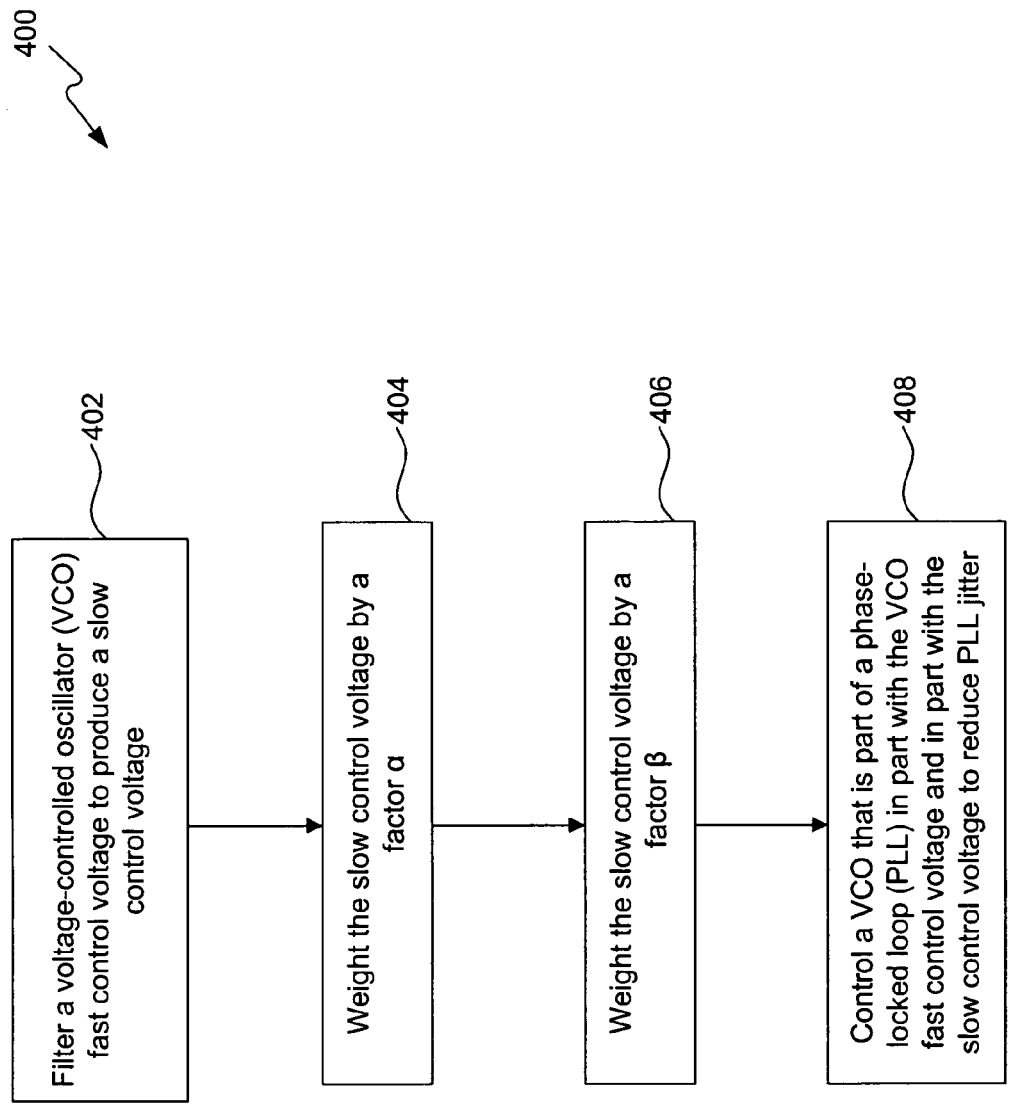
FIG. 4 illustrates a flow chart of an exemplary method for reducing PLL jitter.

FIG. 4 illustrates a flow chart 400 that further describes embodiments as discussed herein. In step 402, filter a VCO fast control voltage to produce a slow control voltage. In examples, the filtering includes low-pass filtering the VCO fast control voltage to produce the slow control voltage. In an example, the VCO fast control voltage is the fast control voltage (Vcf) 120 and the slow control voltage is the slow control voltage (Vcs) 124.

In step 404, weight the VCO fast control voltage by the factor α. In an example, the first variable current source 330 weights the fast control voltage (Vcf) 120 by the factor α by multiplying the fast control voltage (Vcf) 120 by the fast proportioning transconductance ($gm_1$) to create the fast control current (Icf) 204.

In step 406, weight the slow control voltage by the factor β. In an example, the second variable current source 332 weights the slow control voltage (Vcs) 124 by the factor β by multiplying the slow control voltage (Vcs) 124 by the slow proportioning transconductance (gm₂) to create the slow control current (Ics) 208.

In step 408, control the VCO that is part of the phase-locked loop (PLL) in part with the VCO fast control voltage and in part with the slow control voltage to reduce the PLL jitter. For example, control the VCO with the weighted VCO fast control voltage and with the weighted slow control voltage from step 406. In an example, the VCO control current is varied at least in part with the slow control voltage. The VCO control current may be mirrored to isolate the voltage-controlled current source, match impedance, maintain signal linearity, or prevent reverse signal leakage. The controlling of the VCO alters the VCO output frequency. In an example, the fast control current (Icf) 204 and the slow control current (Ics) 208 are added to create the control current (Ic) 201 which controls the current-controlled oscillator 214.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A circuit that reduces jitter in a phase-locked loop (PLL), comprising:
   a filter having an input and an output, wherein said filter is part of the PLL; and
   a summation circuit coupled to said filter input and said filter output, wherein said summation circuit is configured to add a part of a filter output signal and a part of a filter input signal to provide a voltage controlled oscillator (VCO) control signal that reduces the jitter,
   wherein said filter input is coupled to a loop filter having a resistor coupled to a capacitor via a node, wherein said filter input is coupled to said node.

2. The circuit of claim 1, wherein the circuit is deposited on a substrate.

3. The circuit of claim 1, wherein said filter includes a low pass filter.

4. The circuit of claim 3, wherein said low pass filter includes:
   an amplifier having a first input, a second input, and an output, wherein said amplifier first input is coupled to said filter input, further wherein said amplifier second input is coupled to said amplifier output;
   a resistor coupled between said amplifier output and said filter output; and
   a capacitor coupled between said filter output and ground.

5. The circuit of claim 1, further comprising:
   a first variable current source having an output coupled to a node and a control input coupled to said filter input; and
   a second variable current source having an output coupled to said node and a control input coupled to said filter output;
   wherein said node is coupled to a current-controlled oscillator.

6. The circuit of claim 5, further including a mirror circuit coupled between said node and said current-controlled oscillator.

7. The circuit of claim 1, further including a proportioning circuit coupled between said filter and said summation circuit, wherein said proportioning circuit weights said filter output signal and said filter input signal.

8. A method to reduce jitter in a phase-locked loop (PLL), comprising:
   receiving a filter input signal;
   filtering said filter input signal with a low-pass resistor-capacitor filter to produce a filter output signal;
   adding said filter input signal with said filter output signal to produce a voltage controlled oscillator (VCO) control signal; and
   controlling a VCO with said VCO control signal to reduce the jitter.

9. The method of claim 8, wherein said filtering includes low-pass filtering.

10. The method of claim 8, wherein said controlling includes varying a VCO control current at least in part with said filter output signal.

11. The method of claim 10, wherein said controlling includes at least one of controlling a first voltage-controlled current source with said filter output signal to vary said VCO control current and controlling a second voltage-controlled current source with said filter input signal to vary said VCO control current.

12. The method of claim 10, wherein said controlling includes mirroring said VCO control current.

13. The method of claim 8, wherein said controlling includes altering a VCO output frequency with said VCO control signal.

14. The method of claim 8, further comprising:
   weighting said filter input signal by a first factor; and
   weighting said filter output signal by a second factor.

15. The method of claim 8, wherein said controlling includes:
   multiplying said filter input signal by a first proportioning transconductance to create a first control current;
   multiplying said filter output signal by a second proportioning transconductance to create a second control current; and
   adding said first control current with said second control current to create a VCO control current;
   wherein said VCO control current controls said VCO.

16. A circuit that reduces phase-locked loop (PLL) jitter, comprising:
   means for receiving a filter input signal;
   means for filtering said filter input signal to produce a filter output signal;
   means for adding said filter input signal with said filter output signal to produce a voltage controlled oscillator (VCO) control signal; and
   means for controlling a VCO with said VCO control signal to reduce the jitter.

17. The circuit of claim 16, wherein said controlling means includes means for varying a VCO control current at least in part with said filter output signal.

18. The circuit of claim 16, further comprising:
   means for weighting said filter input signal by a first factor; and
   means for weighting said filter output signal by a second factor.

19. The circuit of claim 16, wherein said controlling means includes:
   means for multiplying said filter input signal by a first proportioning transconductance to create a first control current;
   means for multiplying said filter output signal by a second proportioning transconductance to create a second control current; and
   means for adding said first control current and said second control current to create a VCO control current;
   wherein said VCO control current controls said VCO.

* * * * *